(12) United States Patent
Chuang et al.

(10) Patent No.: US 6,802,930 B2
(45) Date of Patent: Oct. 12, 2004

(54) METHOD OF MAKING A LAMINATED STRUCTURE

(75) Inventors: Ling-Yi Chuang, Hsinchu (TW); Li-Chang Lu, Hsinchu Hsien (TW)

(73) Assignee: AU Optronics Corporation, Hsin-Chu (TW)

( * ) Notice: Subject to any disclaimer, the term of this patent is extended or adjusted under 35 U.S.C. 154(b) by 268 days.

(21) Appl. No.: 10/057,605

(22) Filed: Jan. 24, 2002

(65) Prior Publication Data

US 2002/0074385 A1 Jun. 20, 2002

Related U.S. Application Data

(62) Division of application No. 09/920,370, filed on Aug. 1, 2001.

(30) Foreign Application Priority Data

Dec. 16, 2000 (TW) ........................................ 89126964 A

(51) Int. Cl.⁷ .............................................. H01L 23/48
(52) U.S. Cl. .................... 156/276; 156/306.9; 438/108; 438/119; 438/613
(58) Field of Search ................................ 438/118, 119, 438/108, 612, 613; 156/276, 295, 291, 306.9

(56) References Cited

U.S. PATENT DOCUMENTS 5,065,505 A    11/1991    Matsubara et al.
5,965,064 A  * 10/1999    Yamada et al. ............. 252/512
6,137,162 A  * 10/2000    Park et al. .................. 257/685

OTHER PUBLICATIONS

Flip Chip Technologies, by John Lau(editor), McGraw Hill, 1995, p. 326–331.*

* cited by examiner

Primary Examiner—Blaine Copenheaver
Assistant Examiner—Barbara J. Musser
(74) Attorney, Agent, or Firm—Darby & Darby

(57) ABSTRACT

A first substrate, a second substrate, an intermediate and a plurality of particles form a laminated structure. The first substrate has a first conjunction portion and a second conjunction portion, and the second substrate has a third conjunction portion and a fourth conjunction portion which are characterized by a first hardness. The intermediate is disposed between the first substrate and the second substrate. The particles provided with a second hardness greater than the first hardness are coated on the third conjunction portion to contact the first conjunction portion and coated on the fourth conjunction portion to contact the second conjunction portion. A height difference with reference to the base surface of the second substrate exists between the end surface of the third conjunction portion and the end surface of the fourth conjunction portion. A height difference that exists between the fourth conjunction portion and the third conjunction portion can be compensated for by the particles embedded in the fourth conjunction portion. Thus the bridging of the third conjunction portion and the first conjunction portion can be uniformly performed by the particles located between the two.

3 Claims, 4 Drawing Sheets

METHOD OF MAKING A LAMINATED STRUCTURE

CROSS REFERENCE TO RELATED APPLICATIONS

This application is a divisional application of U.S. application Ser. No. 09/920,370 filed on Aug. 1, 2001, which is hereby incorporated by reference in its entirety.

BACKGROUND OF THE INVENTION

1. Field of the Invention

This invention relates to a laminated structure. More particularly, this invention relates to a laminated structure provided with pairs of corresponding bumps or conjunction portions which are electrically connected to each other by particles embedded.

2. Description of Prior Art

ACF (Anisotropic Conductive Film) is a conductive film composed of epoxy resin and a plurality of metal particles and is often used as interlayer clamped between two corresponding bumps or electrodes of a substrate and LSI (Large Scale Integrated Circuit), COG (Chip On Glass), FPC (Flexible Printed Circuit), PCB (Printed Circuit Board), TAB (Tape Automatic Bonding) or TCP (Tape Carrier Package) so as to form a laminated structure for use in LCD panels.

However, two adjacent bumps or electrodes of the substrate can easily short-circuit or suffer low conductivity when the laminated structure is bent, causing the particles in the ACF that are located between two electrodes, to crowd together.

Further, the manufacturing process of ACF is complicated, and the tolerance of the height difference among the bumps of LSI/FPC/PCB/TCP cannot always be precisely controlled. If the design aims to increase the amount of conductive particles captured by the bumps or electrodes, the size of the bumps or electrodes formed on the LSI/FPC/PCB/TCP cannot be too small to contact the conductive particles within the predetermined area. If the design aims to increase the conductivity between two corresponding bumps or electrodes by increasing the number of particles in the ACF, the effective space (Fine Pitch Design) between any two of the adjacent bumps or electrodes cannot be so narrow as to cause a short circuit.

FIGS. 1A, 1B and 1C are three plan views sequentially depicting the steps for forming a laminated structure 1 according to a prior art. The substrate 11, 12 are two conductive plates of LSI/COG/FPC/PCB/TAB/TCP.

As shown in FIG. 1A, the laminated structure 1 is composed of two substrates 11(12), a plurality of conductive particles 13 and an epoxy 14. The substrate 11 has a surface 110 with a plurality of spaced bumps A1~A3, and the substrate 12 has a surface 120 with a plurality of spaced bumps (B1~B3) corresponding to bumps A1~A3. The so-called Anisotropic Conductive Film (ACF) is made of epoxy 14 mixed with the particles 13, and the ACF is used as an intermediate to bond the substrates 11 and the substrates 12 together and electrically connect the substrates 11 to the substrates 12. The bumps A1~A3 of the substrate 11 are respectively provided with end surfaces A01, A02 and A03, and the bumps B1~B3 of the substrate 12 are respectively provided with end surfaces B01, B02 and B03. A height difference t1 exists between the bump B1 and the bump B2, and another height difference t2 exists between bump B2 and bump B3.

FIG. 1B shows the substrate 11 and the substrate 12 being brought toward each other by the application of a clamping force F. FIG. 1C shows the first substrate 21 and the second substrate 22 being combined together by the epoxy 14 and electrically connected to each other via the particles 13.

In FIG. 1B, a force F is applied on the two substrates 11, 12 to form the laminated structure 1. The epoxy 14 is gradually deformed and thinned by the approaching substrates 11 and 12, and then the particles 13 stored in the epoxy 14 are irregularly dispersed during the clamping process. Then, the bump A1 and the bump B1, the bump A2 and the bump B2, the bump A3 and the bump B3 respectively clamp the particles 13 stored in the epoxy 14 as shown in FIG. 1C.

However, with the height differences t1 and t2 between bump B2 and bump B1, B2, the number of the particles 13 clamped between each two corresponding bumps is quite different, i.e. the particles 13 are not easily captured by the any two corresponding bumps. Moreover, a short circuit may occur between any two of the bumps of the substrate 11 or 12 between which the number of the particles 13 is dense.

U.S. Pat. No. 5,065,505 disclosed by Hiroshi Matsubara et al, Sharp Kabushiki Kaisha, mentions that the conductive particles are adhered to the electrodes of the glass board by means of the uncured photocuring adhesive. However, height differences existing among the electrodes cannot be effectively compensated while the circuit board is connected to the electrodes of the glass board.

SUMMARY OF THE INVENTION

The primary object of this invention is to provide a laminated structure, comprising a first substrate, a second substrate, an intermediate and a plurality of particles. The first substrate has a first conjunction portion and a second conjunction portion, and the second substrate has a third conjunction portion and a fourth conjunction portion which are provided with a first hardness. The intermediate is disposed between the first substrate and the second substrate. The particles with a second hardness larger than the first hardness are coated on the third conjunction portion for contacting the first conjunction portion and coated on the fourth conjunction portion for contacting the second conjunction portion. A height difference with reference to the base surface of the second substrate exists between the end surface of the third conjunction portion and the end surface of the fourth conjunction portion.

A height difference is exists between the fourth conjunction portion and the third conjunction portion and the height of the fourth conjunction portion is presupposed lower than that of the third conjunction portion. The height difference can be compensated by the particles embedded in the fourth conjunction portion when a clamping force is applied, and therefore the junction between the third conjunction portion and the first conjunction portion can be uniformly bridged by the particles located therebetween.

BRIEF DESCRIPTION OF THE DRAWINGS

The present invention can be more fully understood by reading the subsequent detailed description and examples with reference made to accompanying drawings in which.

DETAILED DESCRIPTION OF THE PREFERRED EMBODIMENTS

FIGS. 2A to 2D are four plan views sequentially depicting the steps for forming a laminated structure 2 according to the present invention.

Figure 1A:
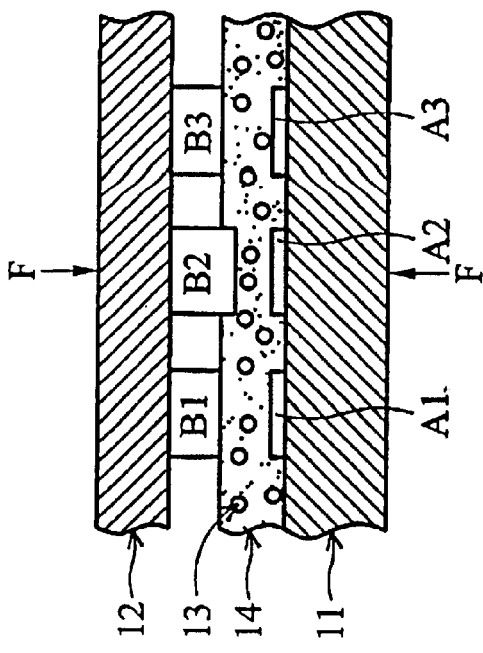
FIGS. 1A to 1C are three plan views sequentially depicting the steps for forming a laminated structure (1) according to a prior art.
Figure 1B:
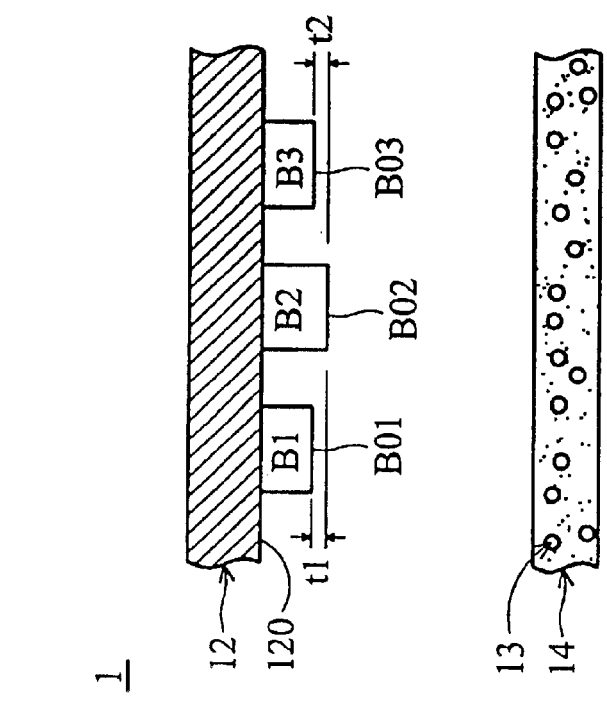
Figure 1C:
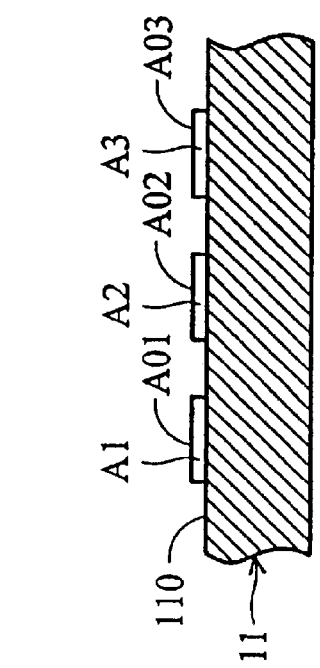
Figure 2A:
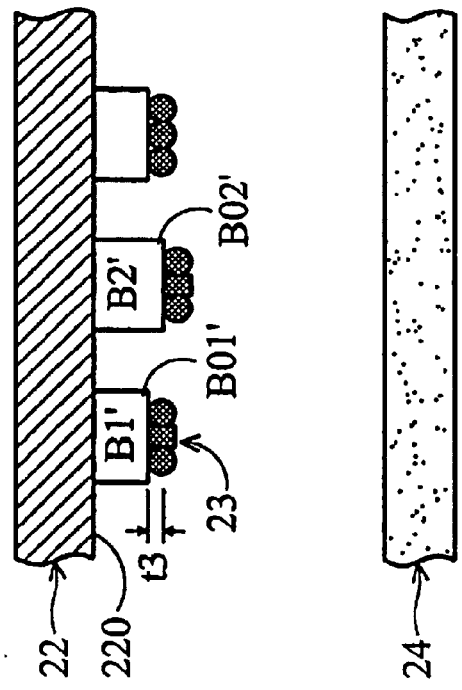
FIGS. 2A to 2D are four plan views sequentially depicting the steps for forming a laminated structure (2) according to the present invention.
Figure 2A:
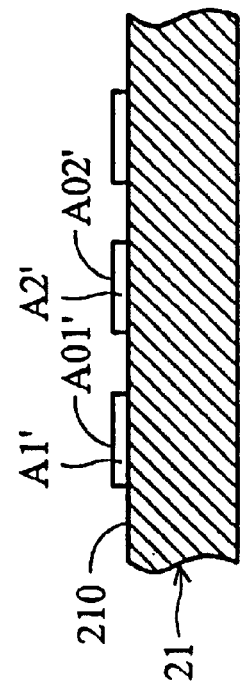
Figure 2B:
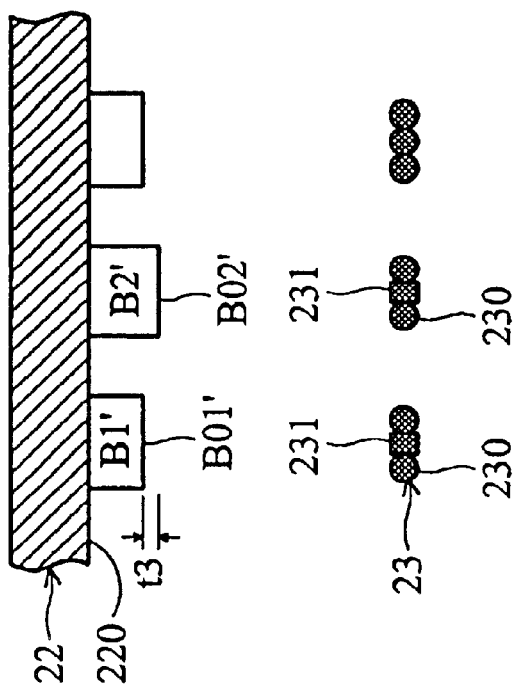
Figure 2B:
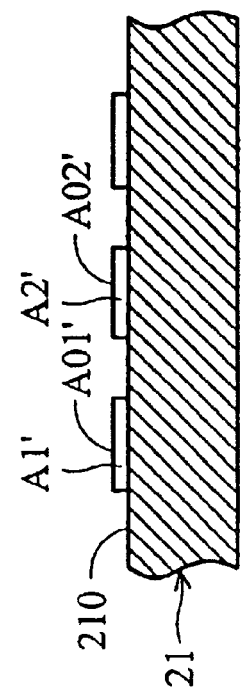

In FIGS. 2A and 2B, the laminated structure 2 comprises a first substrate 21, a second substrate 22, a plurality of particles 23 and an intermediate 24, wherein the first substrate 21 and the second substrate 22 can be the two conductive plates of LSI (Large Scale Integrated Circuit), COG (Chip On Glass), FPC (Flexible Printed Circuit), PCB (Printed Circuit Board) or TAB (Tape Automatic Bonding), TCP (Tape Carrier Package).

The first substrate 21 has a surface 210 provided with bumps, and a first conjunction portion A1' and a second conjunction portion A2' are the two next to each other. The first conjunction portion A1' has an end surface A01' and the second conjunction portion A2' has an end surface A02'. The second substrate 22 has a base surface 220 with bumps, and a third conjunction portion B1' and a fourth conjunction portion B2' are two of them which are next to each other. The third conjunction portion B1' and the fourth conjunction portion B2', partially made of same conductive material such as gold, provide a first hardness. The third conjunction portion B1' has an end surface B01' and the fourth conjunction portion B2' has an end surface B02'.

A height difference t3 exists between the third conjunction portion B1' (end surface B01') and the fourth conjunction portion B2' (end surface B02') with reference to the base surface 220 of the second substrate 22. The particles 23 made of conductive material such as Nickel are provided with a second hardness greater than the first hardness and formed in the shape of ball or cube. In FIG. 2B, the particles 23 are coated on the end surface B01' and the end surface B02', and the intermediate 24 preferably made of rubber such as epoxy is used as an adhesive material disposed between the first substrate 21 and the second substrate 22.

Figure 2D:
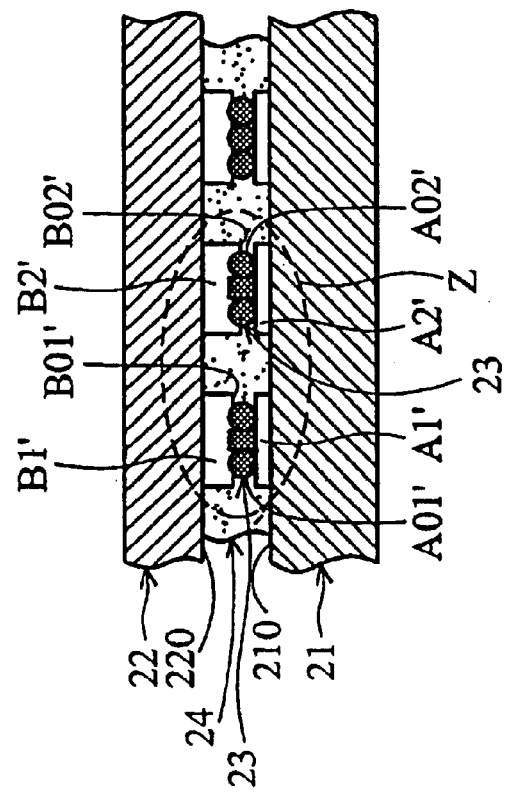
Figure 2C:
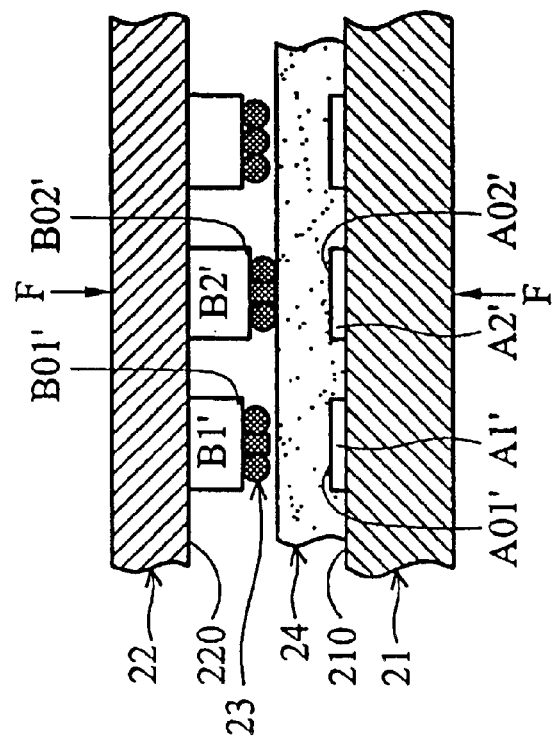

FIG. 2C shows the first substrate 21 and the second substrate 22 being brought together through the application of a clamping force F. FIG. 2D shows the first substrate 21 and the second substrate 22 being combined by the intermediate 24 and electrically connected to each other via the particles 23.

With the force F disposed on the first substrate 21 and the second substrate 22, the particles 23 located on the fourth conjunction portion B2' first contact the end surface A02' of the second conjunction portion A2'. Then, the particles 23, originally located on the end surface B02' of the fourth conjunction portion B2', begin to be embedded in the fourth conjunction portion B2' by the pressure applied by the second conjunction portion A2'. The embedding process can be terminated when the particles 23 located on the end surface B01' of the third conjunction portion B1' uniformly contact the end surface A01' of the first conjunction portion A1'.

Then, the laminated structure 2 is formed and the clamping force F can be removed of the first substrate 21 and the second substrate 22 when the intermediate 24 disposed between the first substrate 21 and the second substrate 22 is solidified.

Figure 3:
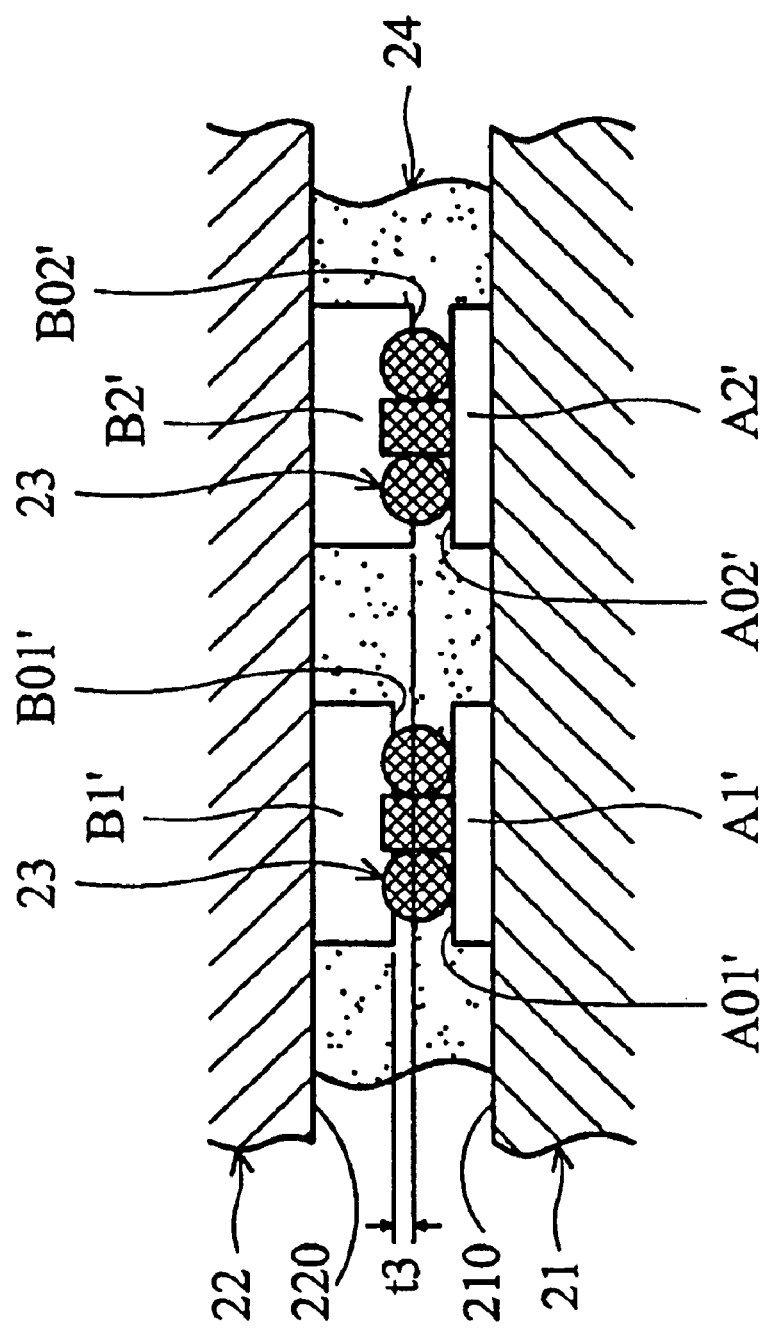
FIG. 3 is an enlarged view according to a dotted line (Z) of FIG. 2D.

FIG. 3 is an enlarged view according to a dotted line Z of FIG. 2D. The height difference t3, between the third conjunction portion B1' (end surface B01') and the fourth conjunction portion B2' (end surface B02') with reference to the base surface 220, can be completely compensated by the embedded particles 23 located on the fourth conjunction portion B2'. The junction between the third conjunction portion B1' and the first conjunction portion A1' can be uniformly performed by the particles 23 located there.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A method for forming a laminated structure, comprising:

providing a first substrate and a second substrate, the first substrate having a first group of conjunction portions and the second substrate having a second group of conjunction portions, a height difference being between the conjunction portions within the second group; and connecting the first substrate to the second substrate to electrically connect the first group conjunction portions and the second group conjunction portion with a plurality of particles, a part of the particles embedded in the second group conjunction portions to compensate the height difference therebetween.

2. A method for forming a laminated structure, comprising:

providing a first substrate and a second substrate, the first substrate having a first conjunction portion and a second conjunction portion and the second substrate having a third conjunction portion and a fourth conjunction portion, the fourth conjunction portion being higher than the third conjunction portion; and connecting the first substrate to the second substrate with a plurality of particles and an intermediate, the particles between the second and fourth conjunction portions embedded in the fourth conjunction portion and the particles between the first and third conjunction portions uniformly bridged therebetween to compensate a height difference between the third conjunction portion and the fourth conjunction portion.

3. The method for forming a laminated structure as claimed in claim 2, wherein the step of connecting the first substrate to the second substrate comprising:

applying the particles on the third conjunction portion and the fourth conjunction portion; and applying the intermediate between the first substrate and the second substrate to electrically connect the third and first Conjunction portions and electrically connect the fourth and second conjunction portions through the particles.

* * * * *